United States Patent
Woo et al.

(10) Patent No.: US 6,806,172 B1
(45) Date of Patent: Oct. 19, 2004

(54) PHYSICAL VAPOR DEPOSITION OF NICKEL

(75) Inventors: Christy Mei-Chu Woo, Cupertino, CA (US); Eric N. Paton, Morgan Hill, CA (US); Susan Tover, Gilroy, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 286 days.

(21) Appl. No.: 09/826,078

(22) Filed: Apr. 5, 2001

(51) Int. Cl.$^7$ ............................................. H01L 21/425
(52) U.S. Cl. ........................ 438/533; 438/534; 438/535; 257/385; 257/386; 257/628
(58) Field of Search ........................ 438/301, 533–535, 438/302, 369, 745, 754, 758; 257/385, 627, 900, 386, 628

(56) References Cited

U.S. PATENT DOCUMENTS

| | | | | |
|---|---|---|---|---|
| 4,965,173 A | * | 10/1990 | Gould | 438/317 |
| 5,162,263 A | * | 11/1992 | Kunishima et al. | 437/200 |
| 6,172,296 B1 | * | 1/2001 | Iwasaki et al. | 136/256 |
| 6,224,682 B1 | * | 5/2001 | Wall et al. | 118/726 |
| 6,225,202 B1 | * | 5/2001 | Gupta et al. | 438/721 |

OTHER PUBLICATIONS

Yaozhi Hu and Sing Pin Tay, "Spectroscopic Ellipsometry Investigation of Nickel Silicide Formation by Rapid Process", J.Vax.Sci. Technol. A 16(3) May/Jun. 1998, pp. 1820–1824.

Toyota Morimoto, Tatsuya Ohguro, Hisayo Sasaki Momose, Toshihiko Iinuma, Iwao Kunishima, Kyoichi Suguro, Ichiro Katkabe, Hiroomi Nakajima, Masakatsu Tsuchiaki, Mizuki Ono, Yasuhiro Katsumata, and Hiroshi Iwai, "Self–Aligned Nickel–Mono–Silicide Technology for High Speed Deep Submicrometer Logic Cmos Ulsi", IEEE Transactions on Electric Devices, vol. 42, No. 5, May 1995.

J. Chen, J.P. Colinge, D. Flandre, R. Gillon, J.P. Raskin, and D. Vanhoenacker, Comparison of TiSi$_2$, CoSi$_2$, and NiSl for Thin–Film Silicon–On–Insulator Applications, J.Electro-Chem Soc., vol. 144, No. 7, Jul. 1997.

T. Ohguro, S. Nakamura, E. Morifuji, M. Ono, T. Yoshitomi, M. Saito, and H. Iwai, "Nitrogen–Doped Nickel Monosilicide Technique for Deep Sbumicron CMOS Salicide", ULSI Research Laboratories, pp. 453–456.

Stanley Wolfand Richard N. Tauber, "Silicon Processing for the VLSI Era volume: 1 Process Technology", 1986 pp. 329–406.

\* cited by examiner

*Primary Examiner*—Duy-Vu Deo

(57) ABSTRACT

Nickel film formation is implemented by heating a deposition chamber during deposition of nickel on a substrate or between processing of two or more substrates or both. Embodiments include forming a nickel silicide on a composite having an exposed silicon surface by introducing the substrate to a PVD chamber having at least one heating element for heating the chamber and depositing a layer of nickel directly on the exposed silicon surface of the composite while concurrently heating the chamber with the heating element.

10 Claims, 4 Drawing Sheets

PHYSICAL VAPOR DEPOSITION OF NICKEL

FIELD OF THE INVENTION

The present invention relates to a method of depositing films of nickel having low electrical resistance. The present invention has particular applicability to manufacturing semiconductor devices, e.g., high-density integrated circuit ("IC") semiconductor devices exhibiting reliable, high quality, adherent, low resistance, well-aligned contacts to source, drain, and gate regions of active devices, such as MOS and CMOS transistors formed in or on a semiconductor substrate. More specifically, the present invention relates to methods of utilizing refractory metal silicide processing methodology to manufacture semiconductor devices having nickel silicide contacts.

BACKGROUND ART

Fabrication of a semiconductor device and an integrated circuit thereof begins with a semiconductor substrate and employs film formation, ion implantation, photolithographic, etching and deposition techniques to form various structural features in or on a semiconductor substrate to attain individual circuit components which are then interconnected to ultimately form an integrated semiconductor device. Escalating requirements for high densification and performance associated with ultra large-scale integration (ULSI) semiconductor devices requires smaller design features, increased transistor and circuit speeds, high reliability and increased manufacturing throughput for competitiveness.

As device dimensions and feature size decrease to the deep sub-micron range, performance difficulties escalate, particularly those caused by an increase in the sheet resistance of the contact areas to the source and drain regions and junction leakage as junction layer thickness decreases. To ameliorate the higher electrical resistance caused by shrinking features, the use of self-aligned, highly electrically conductive refractory metal silicides, i.e., "salicides" (derived from Self-ALIgned-siliCIDE), has become commonplace in the manufacture of IC semiconductor devices, as for example in the manufacture of MOS type transistors.

Salicide technology comprises forming metal silicide layers on the source/drain regions and/or on the gate electrode of a semiconductor device in a self-aligned manner. A conventional approach to reduce resistivity involves forming a multi-layered structure comprising a low resistance refractory metal silicide layer on a doped polycrystalline silicon, typically referred to as a polycide. Salicide technology reduces parasitic sheet and contact resistance in the source and drain diffusion layers and the gate electrode that results from scaling down the source and drain junctions and polycrystalline silicon line width.

Refractory metals commonly employed in salicide processing include platinum (Pt), titanium (Ti), and cobalt (Co), each of which forms very low resistivity phases with Si, e.g., $PtSi_2$, $TiSi_2$, and $CoSi_2$. In practice, the refractory metal is deposited at a uniform thickness over all exposed surface features of a Si wafer, preferably by means of physical vapor deposition ("PVD") process, e.g., sputtering from a target utilizing an ultra-high vacuum, multi-chamber DC magnetron or RF sputtering system. Such PVD tools are commercially available, as for example by Applied Materials, Inc, of Santa Clara, Calif.; and by MRC of Gilbert, Arizona.

Recently, attention has turned towards nickel (Ni) to form nickel silicide utilizing salicide technology. Although the use of Ni in salicide technology has certain advantages over using Ti or Co, there are problems associated with Ni, particularly with the deposition of consistent films of nickel having a low electrical resistance from wafer to wafer. For example, PVD processes used in depositing metal layers are known to have a "first wafer effect" i.e. the physical, chemical and electrical properties of the deposited metal is inconsistent between the first several processed wafers and thus fail to meet acceptable device requirements. First wafer effects results in reduced yields and throughput and poor reliability of silicidation processes and ultimately increases the overall costs thereof.

It has been known that fluctuating chamber hardware conditions results in process inconsistencies which are undesirable for depositing films meeting process specifications and repeatability requirements. To overcome some of these fluctuations, many hardware manufactures advise qualifying the chamber hardware of a deposition tool by heating the chamber under vacuum for a period of time prior to its use in depositing materials on to a semiconductor substrate. Such a process is commonly called a bakeout, where heating under vacuum accelerates the removal of contaminants from the chamber, including driving out water vapor and other gases from the chamber components. However, inconsistencies between substrates having a deposited nickel film are still problematic despite qualifying a chamber prior to its use.

Hence, a continuing need exists for depositing nickel and its alloys repeatably and consistently on substrates in the formation of a low resistivity nickel containing film including the first several substrates. There is also a continuing need for depositing nickel containing films to enable the formation of a low resistivity nickel silicide layer on silicon surfaces of a semiconductor device with high repeatability, reliability and throughput.

SUMMARY OF THE INVENTION

An advantage of the present invention is a reliable and consistent nickel deposition process. Although the nickel deposition process of the present invention is not limited to semiconductor fabrication, it is contemplated that the formation of nickel containing films in accordance with the present invention can be used to manufacture nickel silicide composite structures, particulary composite structures of high-density integrated circuit ("IC") semiconductor devices, such as MOS and CMOS transistors formed in or on a semiconductor substrate.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of depositing a nickel layer on a substrate surface. In one aspect of the invention, the surface is part of a device comprising a gate electrode and source/drain regions. The method comprises introducing a substrate having a surface to a deposition chamber, wherein the deposition chamber has at least one heating clement for heating the deposition chamber; and heating the deposition chamber with the heating element between substrate processing and/or heating while simultaneously depositing a layer of nickel on the substrate.

The present process advantageously minimizes fluctuations between semiconductor processing of nickel deposition. In an embodiment of the present invention, the heating elements can be one or more bakeout lamps that are typically provided with a deposition chamber. In practicing the invention, the bakeout lamps, or other equivalent heating element for heating the deposition chamber, are employed immediately prior to introducing the substrate to the deposition chamber. In another aspect of the present invention, the heating elements are used to heat the deposition chamber continuously, i.e. between the processing and during depositing of nickel films for two or more substrates.

Embodiments of the present invention include, heating the deposition chamber with the heating element after depositing the nickel layer on the substrate and continue heating the deposition chamber while introducing a second substrate to the deposition chamber. By continual heating of the deposition chamber, the present invention advantageously increases the number of useful substrates having a low reistivity nickel film.

Another aspect of the present invention is directed to a method of forming a nickel silicide on a semiconductor device. The method comprises forming a silicon gate electrode, having an upper surface and side surfaces, overlying a semiconductor substrate with a gate dielectric layer therebetween. It is further contemplated that the semiconductor substrate comprise source/drain regions in the semiconductor substrate, and a silicon nitride sidewall spacer disposed on the side surfaces. In accordance with the present invention, the semiconductor substrate is then introduced to a deposition chamber, wherein the deposition chamber has at least one heating element for heating the deposition chamber and heating the deposition chamber with the heating element between the processing of two or more semiconductor substrates and/or heating the chamber while simultaneously depositing a layer of nickel directly on the exposed silicon surfaces of the semiconductor substrate. Nickel silicide layers are then formed by heating the semiconductor substrate to cause the deposited nickel to react with underlying silicon surfaces to form a nickel silicide layer on the gate electrode and a nickel silicide layer on the source/drain regions. The unreacted nickel on non-reactive surfaces, e.g. insulator surfaces, are then removed, as by a wet etch, from the semiconductor substrate.

Embodiments of the present invention include heating the semiconductor substrate to form the nickel silicide layer on the gate electrode and source/drain regions at a temperature of approximately 300° C. to approximately 700° C. and for approximately 10 seconds to approximately 120 seconds and removing the unreacted nickel by immersing the semiconductor substrate in a solution of $NH_4OH$, $H_2O_2$ and water (APM) or immersing the semiconductor substrate in a solution of $H_2SO_4$, $H_2O_2$ and water (SPM).

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein.

DESCRIPTION OF THE INVENTION

Figure 1A:
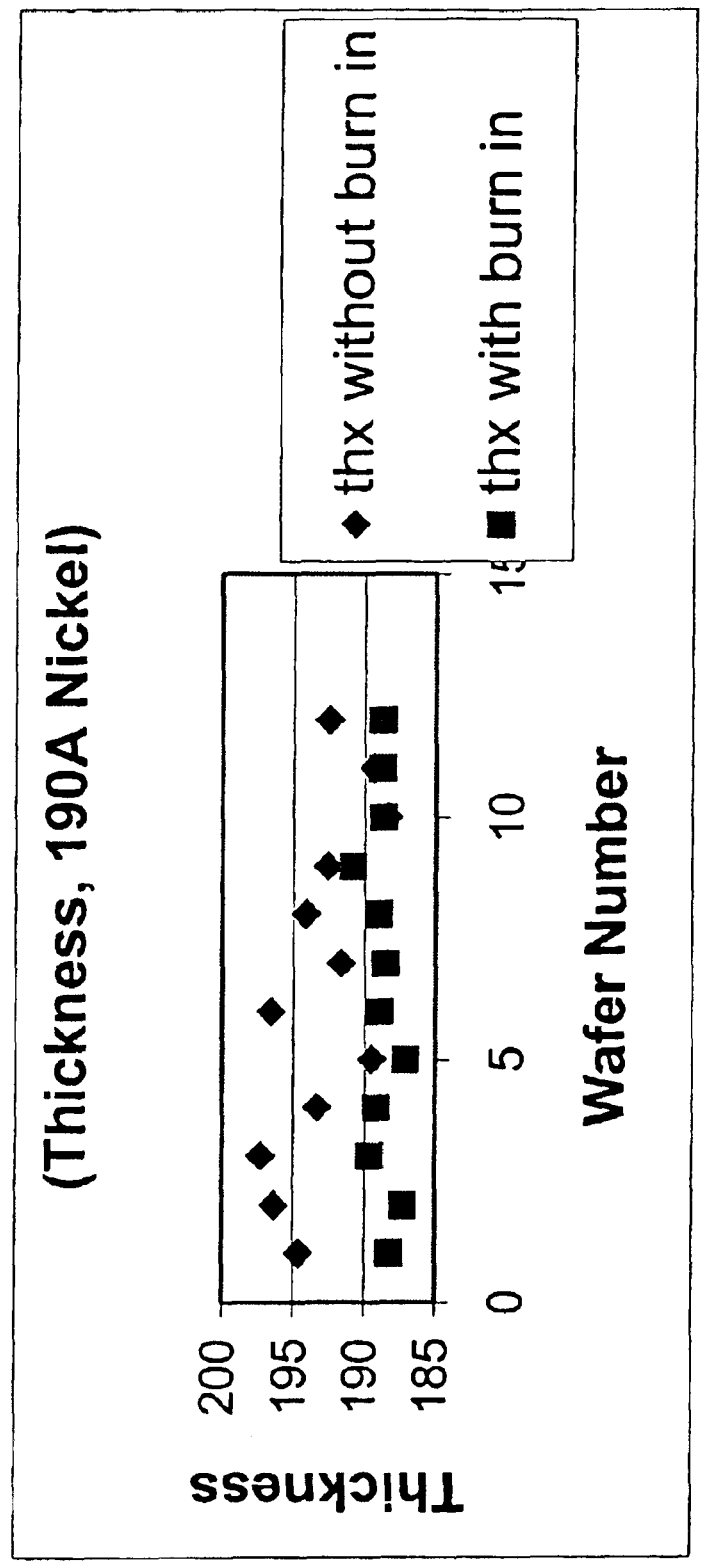
FIGS. 1A and 1B graphically compare thickness and thickness uniformity of a number of deposited nickel films on substrates.

Conventional methodologies for manufacturing nickel films suffer from a variety of processing problems that afflict film uniformity, sheet resistance and uniformity both from wafer to wafer and across individual wafers, thus affecting efficiency and yield. To improve throughput, yield and process uniformity, it was necessary to identify some of the problems associated with forming nickel films on substrates.

Experiments were conducted by studying a variety of process parameters involving depositing a layer of nickel on a substrate by employing a PVD system. In an exemplary PVD system, a target (a plate of the material that is to be deposited, e.g., a high purity nickel target) is connected to a negative voltage supply (direct current (DC) or radio frequency (RF)) while a substrate holder facing the target is either grounded, floating, biased, heated, cooled, or some combination thereof. A gas, such as argon, is introduced into the PVD system, to provide a medium in which a glow discharge can be initiated and maintained. When the glow discharge is started, positive ions strike the target, and target atoms are removed by momentum transfer. These target atoms subsequently condense into a thin film on the substrate, which is on the substrate holder. The pressure used during the deposition of a nickel film can vary from about 0.1 milliTorr (mTorr) to about 50 mTorr and the flow of an ionizable gas can be from about 5 standard cubic centimeters per minute (sccm) to about 50 sccm. Typically the tool power is set at about 100 Watts (W) to about 1,000 W.

In studying different processes of depositing a nickel layer, it has been observed that when the deposition chamber remains idle for an hour or longer between processing substrates, unwanted particles, adverse resistivity and grain size, increase film surface roughness, and general contamination were more prevalent. It has further been observed that non-uniformity, e.g. first wafer effect, in nickel PVD deposition is particularly problematic when the PVD tool has been idle for a period of time. During such idle time, it is believed that the chamber walls cool and the target has a propensity to getter contaminants. It was further discovered that chamber idleness adversely affects wafer to wafer uniformity and the deposition characteristics of nickel deposited films.

The present invention addresses and solves problems related to forming a nickel or nickel alloy layer with high repeatability and consistency by employing the facile method of heating the deposition chamber and/or the substrate during and/or between nickel depositions. It was discovered that by heating the PVD chamber at various stages during the deposition of nickel over a series of substrates that first wafer effects were substantially reduce or eliminated and physical and electrical uniformity of the deposited metal films were improved. Although it has been know to qualify vacuum chambers prior to their use by a bakeout procedure, it is believed that the art has not recognized the advantages of heating during the deposition process to heat the chamber continually during and between wafer processing.

In practicing the present invention, the PVD chamber and/or substrate is heated during and/or before the deposition process. In accordance with the present invention, a nickel layer is deposited on to a substrate surface. Although the present invention is applicable to the use of nickel films in the fabrication of semiconductor devices, it is not limited thereby. The present nickel deposition process can be used in the formation magnetic media, as in the manufacture of hard disk drives, hard coatings and plating process, or any other process requiring the deposition of a nickel film on a substrate. As used herein the term substrate includes any element, composition or material in any form that can support a nickel film or layer.

It has been shown that by heating the deposition chamber and/or substrate between the introduction and removal of substrates during a continuos nickel deposition process that first wafer effects are substantially reduced. For example a series of oxide silicon wafers were individually introduced to a commercial PVD chamber of an Endura PVD tool equipped with one or more bakeout lamps available from Applied Materials, of Santa Clara, Calif. The bakeout lamps (115–125 Volt/500 Watt lamps manufactured by Sylvania) heat the chamber and/or the substrate introduced in to the chamber and can be adjusted from 0% to 100% performance. For example, at a lamp setting of 10%, approximately 2 Amps of current is applied to the lamp and at a setting of 100% about 7 Amps of current is applied to the lamp. The following lamp settings approximate the amount of current supplied to the lamps:

10% =about 2 Amps 60% =about 5 Amps 20% =about 3 Amps 70% =about 6 Amps 30% =about 4 Amps 80% =about 6 Amps 40% =about 4 Amps 90% =about 7 Amps 50% =about 5 Amps 100% =about 7 Amps Prior to processing a series of semiconductor substrates, a sacrificial substrate is typically processed for an initial pasting time. In an embodiment of the present invention, one burn-in wafer is processed prior to running a series of substrates. For example, prior to running a series of semiconductor wafers, one wafer was processed at 900 W for 100 seconds (which is equivalent to 0.025 Kilowatt hours) prior to processing the remaining wafers.

In an experiment, after burning-in a single wafer, several oxide wafers were sequentially introduced to a commercial PVD chamber, such as that of an Endura PVD tool. The chamber was maintained at about 2–3 mTorr while Argon was provided at 15 sccm. The tool power set at about 900 W. A layer of approximately 190 A of nickel was deposited on the oxide wafers and their sheet resistance measured. One set of wafers were introduced to the chamber when the bakeout lamps were on at about 30% for at least 2 hours prior to processing. A second set was introduced to the chamber without having the bakeout lamps on.

Figure 1B:
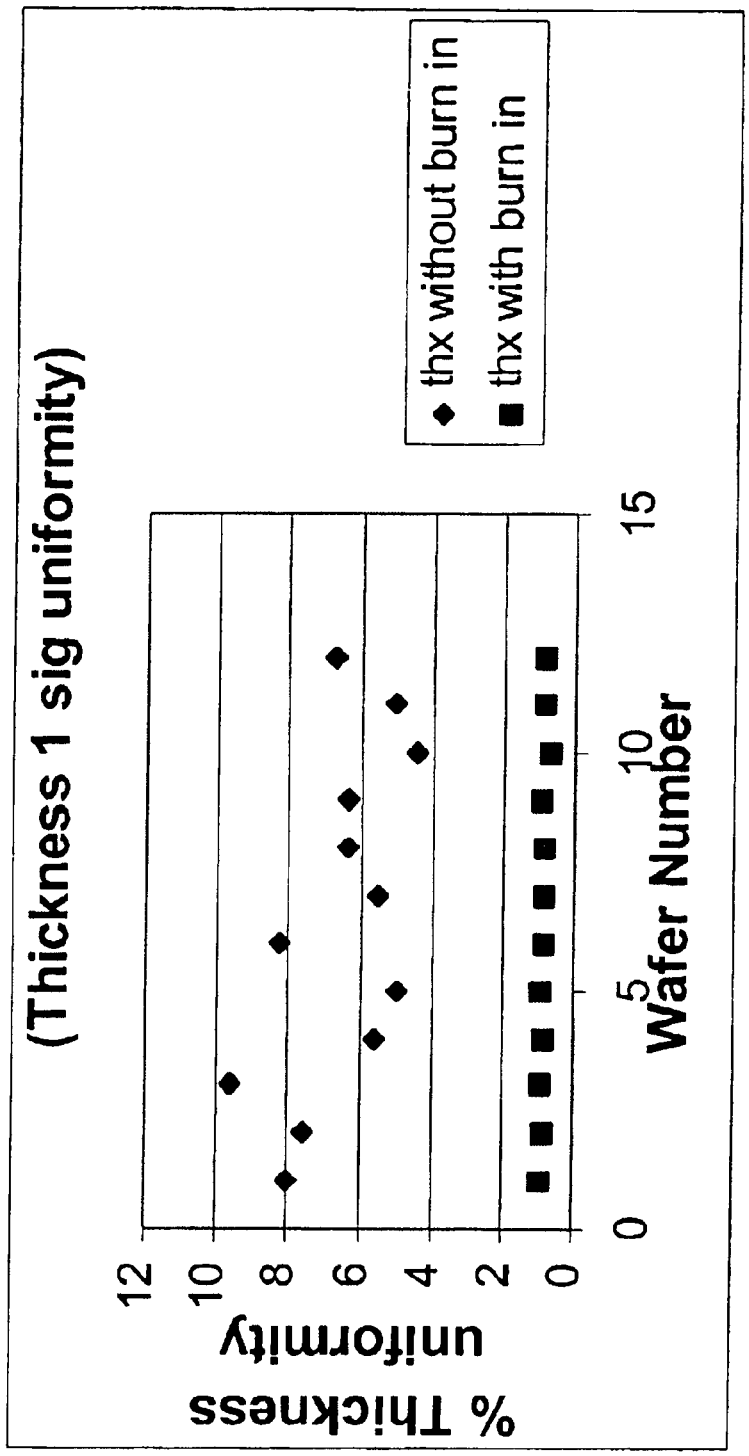

As graphically shown in FIGS. 1A and 1B, the thickness of the deposited nickel on the set of wafers that were introduced to the deposition chamber with the bakeout lamps on prior to processing had good repeatability and uniformity. The graphs show thickness measurement by Elisometer/reflectivity measurement with edge exclusion of about 3mm /49 points measured across each wafer. Improved sheet resistance was also observed as well as consistency. The sheet resistance was consistent from day to day and 1 sigma for all wafers was about 2% and wafer to wafer standard deviation was as low as about 0.08%

Although the present invention can be practiced with other processes that employ depositing nickel or nickel alloy films, it is suited for the formation of silicide technology. In an embodiment of the present invention, a nickel layer is deposited on a substrate comprising silicon, e.g. doped and polycrystalline silicon, amorphous silicon, or any silicon surface that can react with the deposited nickel to from a nickel silicide. One or more heating elements, such as one or more conventional bakeout lamps typically provided with a PVD tool, is employed to heat the PVD chamber. In an embodiment of the present invention, the bakeout lamps heat the PVD chamber concurrently with the deposition of the nickel metal. In another embodiment of the present invention, the bakeout lamps heat the PVD chamber between semiconductor processing, i.e. during idle time, and in another aspect of the present invention, the PVD chamber is heated continuously during and between nickel deposition steps.

Figure 3:
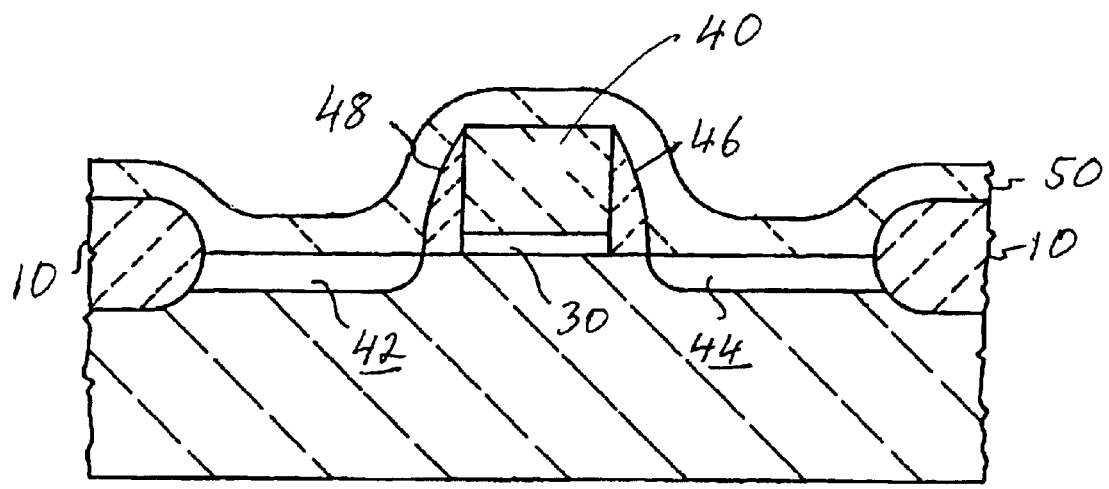
Figure 4:
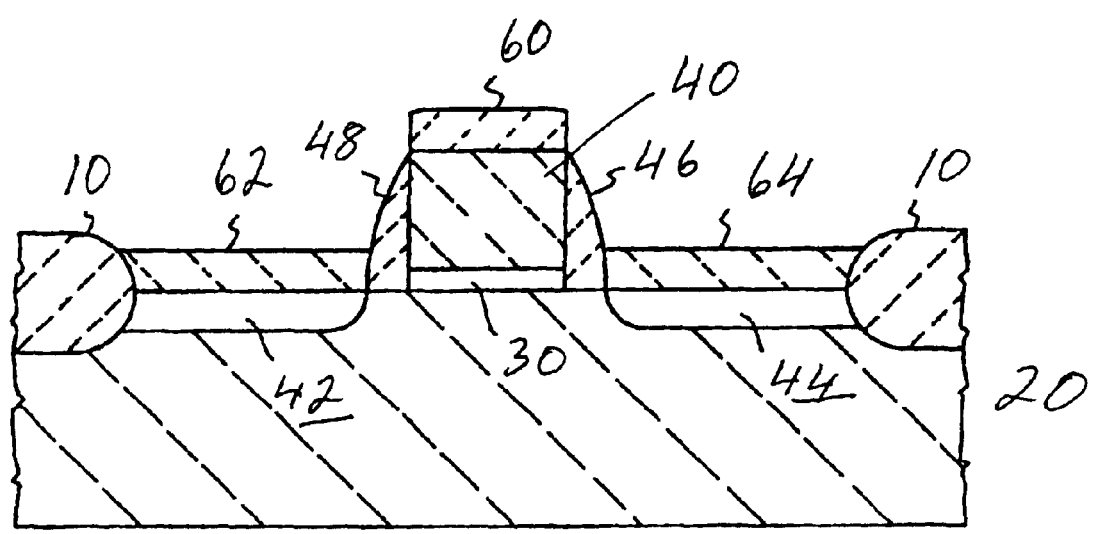

The present invention advantageously enables the consistent and reliable formation of a nickel silicide layer, e.g., NiSi, on the gate electrode and on source/drain regions of a semiconductor substrate. Embodiments of the present invention are shown in FIGS. 2–4, which illustrate sequential views of the formation of a composite gate structure.

Figure 2:
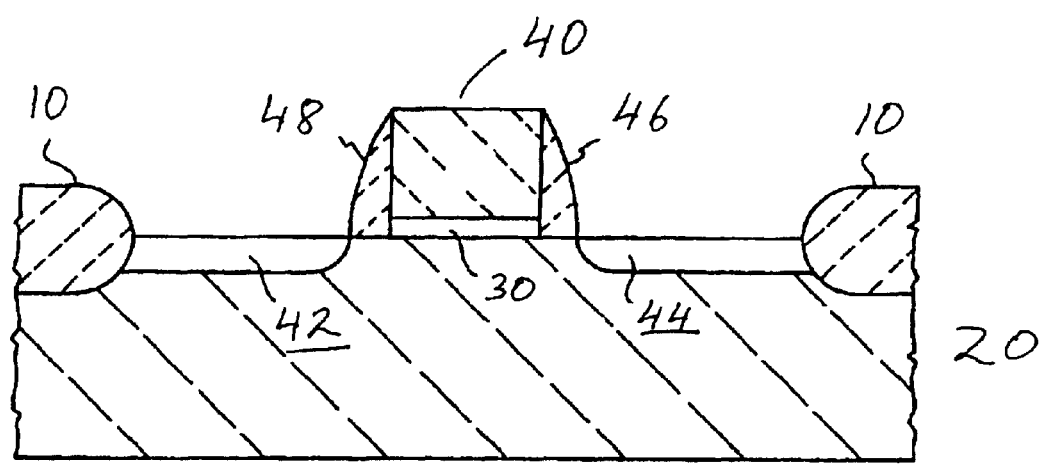
FIGS. 2–4 schematically illustrate sequential phases in the formation of a semiconductor device having nickel silicide layers in accordance with an embodiment of the present invention.

As illustrated in FIG. 2, field oxide areas 10 are formed in a semiconductor substrate 20, as by STI or LOCOS. As used throughout the present disclosure and claims, the term "substrate" includes a semiconductor substrate or an epitaxial layer formed on the semiconductor substrate. A gate oxide layer 30 is formed, as by thermal oxidation, on the surface of substrate 20, followed by the formation of gate electrode 40, such as by deposition of a polysilicon layer, masking of the polysilicon layer, and etching. Gate electrode 40 is typically formed at a thickness of about 1,000 A to about 2,000 A. Gate 40 will be associated with source/drain regions 42 and 44 formed by implantation of n-type impurities or by implantation of p-type impurities.

N-type impurities NLDD, such as arsenic, phosphorus and/or other materials used to enhance transistor characteristics, are then implanted, as by ion implantation, in substrate 20 to form n-type lightly or moderately doped source/drain extension implants, which form n-type stepped source/drain implants in conjunction with n-type moderate or heavy source/drain implants. Likewise, P-type impurities PLDD, such as boron and/or other materials used to enhance transistor characteristics, can be implanted, as by ion implantation, in substrate 20 to form p-type lightly or moderately doped source/drain extension implants which form p-type stepped source/drain implants in conjunction with p-type moderate or heavy source/drain implants.

A layer of an insulating material, such as silicon dioxide or silicon nitride, is then deposited, as by LPCVD or thermally grown, and then anisotropically etched to form sidewall spacers 46 and 48 on the side surfaces of gate electrode 40. After the etching procedure, sidewall spacers 46 and 48 preferably extend from the gate electrodes from about 75 Å to about 300 Å. Sputter etching in argon is conducted to remove the thin oxide layer from the exposed surfaces of the silicon nitride sidewall spacers 46 and 48, from the upper surface of the gate electrode 40 and from the exposed surface of substrate 20, such as source/drain regions 42 and 44.

N-type impurities NS/D, such as arsenic, phosphorus and/or other materials used to enhance transistor characteristics, are then implanted, as by ion implantation, in substrate 20 to form n-type moderate or heavy source/drain implants. Likewise, P-type impurities PS/D, such as boron and/or other materials used to enhance transistor characteristics can also be used, as by ion implantation, in substrate 20, to form p-type moderate or heavy source/drain implants.

As in conventional MOS processing, impurities NLDD and PLDD are implanted at a dosage about 1–2 orders of magnitude lower than that of impurities NS/D and PS/D, and at a substantially lower energy; e.g., less than about 10 keV versus about 30 keV for NS/D and less than about 10 keV versus about 20 keV for PS/D.

Substrate 20 is then heated to diffuse and electrically activate implanted impurities NLDD, PLDD, NS/D and PS/D in stepped source/drain implants, as by rapid thermal annealing at a temperature of about 900° C. to about 1100° C. for less than about 30 seconds. Preferably, NS/D and NLDD implants are performed at a higher energy than the PS/D and PLDD implants, resulting in the n-type stepped source/drain implants 40 being deeper than p-type stepped source/drain implants.

In an embodiment of the present invention, a nickel layer is deposited directly on to substrate surface, e.g. an exposed silicon surface. Prior to depositing the nickel layer, oxide films on the source, drain and gate were removed, as by dipping the substrate in a dilute solution of HF, i.e. an HF dip. Alternatively, the substrate can be subjected to a biased sputter clean to clean any remaining oxide from the surface.

In accordance with the present invention, a substrate having at least one exposed silicon containing surface is introduced in to a deposition chamber. Many deposition chambers are commercially available for depositing a nickel layer on to a substrate. In an embodiment of the present invention, the substrate is placed in to a PVD chamber of an Endura PVD tool equipped with bakeout lamps available from Applied Materials, of Santa Clara, Calif.

In practicing the embodiment of the present invention, the bakeout lamps are used to heat the deposition chamber between the process of forming nickel silicide layers on multiple substrates and/or during the deposition of nickel. In an embodiment of the present invention, a layer of nickel is deposited on the substrate while heating the PVD chamber with the bakeout lamps. The heating elements are employed to maintain consistent deposition of the nickel over the substrate. For example, when employing the Endura tool, the bakeout lamps should be set about 10% to about 70% of their maximum current of about 7 Amps. It is believed that the same result can be achieved by heating the chamber from about 25° C. to about 400° C.

As shown in FIG. 3, nickel layer 50 is deposited over the surface of the substrate including directly on the exposed silicon surfaces of the gate, source and drain. The nickel layer is also deposited on insulating surfaces 10, 46 and 48. The nickel can be sputter deposit over the composite structure to a thickness of about 10 nm to about 100 nm with the use of Agron and/or nitrogen gas in the Endura PVD system.

To achieve the desired nickel silicide layer, e.g., NiSi, the substrate is heated, e.g., as by rapid thermal annealing or furnace annealing, to react the deposited Ni with underlying Si to form a nickel silicide layer on the exposed reactive silicon containing surfaces. In an embodiment of the present invention, heating is conducted at a temperature in the range of about 300–1050° C., e.g. from about 300° C. to about 700° C. During heating, a nickel silicide layer 60, e.g., NiSi, is formed on the gate electrode 40 and nickel silicide layers 62 and 64 are formed on the source/drain regions 42 and 44, as shown in FIG. 4. In an embodiment of the present invention, the substrate having a layer of nickel directly on reactive silicon surfaces is heated to 550° C. under atmospheric pressure with nitrogen gas for approximately 5 seconds to approximately 2 minutes, e.g. for approximately 15 seconds to approximately 60 seconds.

Unreacted nickel on the substrate is then easily removed, as by wet chemical stripping. In an embodiment of the present invention, the unreacted Ni is removed by immersing the substrate into a solution of $H_2SO_4$, $H_2O_2$ and water (SPM) or a solution of $NH_4OH$, $H_2O_2$ and water (APM).

Although the forgoing examples illustrate the formation of a nickel film and the corresponding nickel silicide on a single substrate, the present invention also contemplates and advantageously provides for reduced inconsistencies between processing a batch of substrates for nickel film formation. In accordance with the present invention, the nickel deposition chamber is heated between processing substrates to advantageously reduce or otherwise minimize electrical inconsistencies between the processing of several substrates, improving consistency, throughput and yield. Hence, nickel deposition processing of multiple substrates can benefit from the present invention.

In an embodiment of the present invention a batch of substrates are prepared for nickel deposition. The deposition chamber is heated prior to introducing a first substrate out of a batch of substrates to be processed. In accordance with the present invention, a layer of nickel is sputter deposited directly on the exposed silicon surface of the first substrate, as by employing a Endura PVD tool. The first substrate is then removed and a second, third, four, etc. substrate is introduced to the chamber for deposition of a nickel layer thereon. During the period of depositing the nickel layer on the first substrate and depositing the nickel layer on subsequent substrates, the chamber is continuously heated with the bakeout lamps. For example, when employing the Endura tool, the bakeout lamps should be powered from about 10% to about 70% of their maximum power of about 7 Amps, e.g. around 30% of the lamp power or about 4 Amps. It is believed that the same results can be achieved by heating and maintain the chamber from about 25° C. to about 400° C. The present invention contemplates heating the chamber during nickel deposition and between substrate processing to maintain a relatively constant temperature during nickel deposition of a batch or substrates.

Advantageously, the presently formed nickel silicides do not require a cap layer before RTA to prevent oxygen contamination. Additional process steps, such as the formation of metal contacts to electrically connect gate electrodes, formation of insulative layers to isolate the various features, and formation of inter-level metallization, complete and integrate the device.

The present invention is applicable to the manufacture of various types of semiconductor devices, particularly high-density semiconductor devices having a design rule of about 0.18 $\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of forming nickel layers in a deposition chamber on a plurality of substrates, the deposition chamber having at least one heating element the method comprising:

heating the deposition chamber with the at least one heating element prior to introduction of a first substrate;

introducing the first substrate to the deposition chamber while heating the deposition chamber with the at least one heating element;

depositing a layer of nickel on the first substrate while heating the deposition chamber with the at least one heating element;

removing the first substrate from the deposition chamber while heating the deposition chamber with the at least one heating element;

introducing a second substrate to the deposition chamber while heating the deposition chamber with the at least one heating element; and depositing a layer of nickel on the second substrate while heating the deposition chamber with the at least one heating element, wherein the chamber is heated with the at least one heating element continuously between the removal of the first substrate and the introduction of the second substrate.

2. The method according to claim 1, wherein the at least one heating element comprises a lamp.

3. The method according to claim 2, further comprising powering the at least one lamp from about 2 Amp to about 7 Amps during the introduction of both of the first and second substrates to the deposition chamber and during deposition of the nickel layer.

4. The method according to claim 1, wherein each substrate comprises silicon and the deposited nickel layer is heated to form a nickel silicide layer.

5. A The method according to claim 1, further comprising cleaning each substrate prior to depositing the layer of nickel.

6. The method according to claim 1, wherein the layer of nickel is formed on exposed silicon surfaces of each substrate and the method further comprising:

heating the layer of nickel at a temperature of approximately 300° C. to approximately 550° C. to form a nickel silicide layer.

7. The method according to claim 6, wherein the heating of the layer of nickel to form the nickel silicide layer is carried out for approximately 5 seconds to approximately 2 minute.

8. A The method according to claim 7, further comprising removing unreacted nickel by wet chemical etching.

9. The method according to claim 8, wherein the removing unreacted nickel is carried by immersing each substrate in a solution of $NH_4OH$, $H_2O_2$ and water or immersing each substrate in a solution of $H_2SO_4$, $H_2O_2$ and water.

10. The method according to claim 9, further comprising forming a conductive connection to the nickel silicide layers without using a cap layer.

* * * * *